(12) United States Patent
Kitajima et al.

(10) Patent No.: US 6,893,512 B2
(45) Date of Patent: May 17, 2005

(54) SOLDER ALLOY AND SOLDERED BOND

(75) Inventors: Masayuki Kitajima, Kawasaki (JP);
Tadaaki Shono, Kawasaki (JP);
Masakazu Takesue, Kawasaki (JP);
Yutaka Noda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 204 days.

(21) Appl. No.: 10/356,546

(22) Filed: Feb. 3, 2003

(65) Prior Publication Data

US 2003/0143104 A1 Jul. 31, 2003

Related U.S. Application Data

(63) Continuation of application No. PCT/JP02/00390, filed on Jan. 21, 2002.

(51) Int. Cl.[7] ............................ B23K 35/26; C22C 13/00
(52) U.S. Cl. ........................................ 148/400; 420/557
(58) Field of Search ............................ 148/400; 420/557

(56) References Cited

FOREIGN PATENT DOCUMENTS

| EP | 0 976 489 A1 | | 2/2000 |
|---|---|---|---|
| JP | 8-19892 | | 1/1996 |
| JP | 9-174278 | | 7/1997 |
| JP | 2000-15478 | | 1/2000 |
| JP | 2000015478 | * | 1/2000 |
| JP | 2000141078 | * | 5/2000 |
| JP | 2001-347394 | | 12/2001 |
| JP | 2002-1575 | | 1/2002 |

* cited by examiner

*Primary Examiner*—Sikyin Ip
(74) *Attorney, Agent, or Firm*—Armstrong, Kratz, Quintos, Hanson & Brooks, LLP

(57) ABSTRACT

A solder alloy having a solderability comparable to that of a conventional Pb—Sn solder alloy without having a detrimental effect on the environment and a soldered bond using the same. A solder alloy consisting of Zn: 4.0–10.0 wt %, In: 1.0 to 15.0 wt %, Al: 0.0020 to 0.0100 wt %, and the balance of Sn and unavoidable impurities. A soldered bond of an electric or electronic device composed of the above solder alloy.

3 Claims, 11 Drawing Sheets

SOLDER ALLOY AND SOLDERED BOND

CROSS-REFERENCE TO RELATED APPLICATION

This application is a continuation application and is based upon PCT/JP02/00390 filed on Jan. 21, 2002.

TECHNICAL FIELD

The present invention relates to a solder alloy high in safety to the environment and a soldered bond of an electric or electronic device using the same.

BACKGROUND ART

In the past, for soldering in various kinds of electric and electronic devices, much use has been made of lead-tin (Pb—Sn) based solder alloys from the viewpoint of their low melting point, good wettability even in the air or other oxidizing atmospheres, etc. On the other hand, since Pb has toxicity, regulations have conventionally been imposed on operations using Pb or Pb-containing alloys etc. The frequency of occurrence of Pb poisoning etc. has heretofore been kept extremely low.

Due to the recent rising increase in interest in environmental protection, however, the social trend is to require measures to be taken for the disposal of various devices using Pb-containing solder alloys, in particular electric and electronic devices.

Up until now, used electronic devices have mainly generally been disposed of by dumping at landfills in the same way as ordinary industrial waste or general waste. However, if continuing to dispose of used electronic devices using large amounts of Pb-containing alloys by dumping at landfills, there is a concern that the elution of Pb will have a harmful effect on the environment and life.

Therefore, in the future, it will probably be made compulsory to dispose of used electronic devices using large amounts of Pb-containing solder alloy only after recovering the Pb.

However, up to now, no technology has been established for efficiently and effectively removing the Pb from used electronic devices. Further, the recovery costs of the Pb are liable to cause an increase in the cost of the products.

Therefore, development of a Pb-free solder alloy not containing any Pb is strongly desired.

Up unto now, as a Pb-free solder alloy, for example an alloy based on Sn and containing in combination Zn (zinc), Ag (silver), Bi (bismuth), Cu (copper), and the like has been put into limited practical use, but this has been limited to special applications. This is because the various characteristics required in general applications which have used Pb—Sn solder alloys in the past, that is, a low melting point and good wettability, capability for reflow treatment, freedom from reaction with the base material to cause formation of a brittle compound layer or an embrittled layer, and other characteristics (solderability) have not been obtained.

At the present time, a Sn—Zn solder alloy is being proposed as a promising Pb-free solder alloy. A Sn—Zn solder alloy has a melting point of near 200° C. and may very well be able to replace a conventional Sn—Pb solder alloy.

However, Zn easily oxidizes and is poor in solder wettability, so it is necessary to use nitrogen gas or another non-oxidizing atmosphere in order to ensure good solderability.

To improve the solder wettability of a Sn—Zn solder alloy, it is proposed to add Cu (copper) or Ge (germanium), but the anticipated improvement in the wettability is not obtained. Instead, the addition of C causes rapid formation of Cu—Zn intermetallic compounds in the solder alloy, so has the defect of deterioration of the properties of the solder alloy.

Moreover, Zn has an extremely high activity. When soldering on a Cu base material, a thick layer of Cu—Zn intermetallic compounds ends up easily forming even with a small heat input and becomes a cause of reduction of the bond strength. The base material/solder interface structure in this case presumably has a structure of a Cu base material/ $\beta'$-CuZn layer/$\gamma$-Cu$_5$Zn$_8$ layer/solder layer. A Cu—Zn intermetallic compound has a very weak bond strength at the interface with the solder, so exfoliation easily occurs. A similar phenomenon ends up occurring even when the surface of a Cu base material is plated with Ni (nickel)/Au (gold), plated with palladium, and plated with palladium/ gold. Therefore, from the viewpoint of the reliability of the electronic device, practical use of a Sn—Zn solder alloy has been difficult.

DISCLOSURE OF THE INVENTION

The present invention has as its object the provision of a solder alloy having a solderability comparable to that of a conventional Pb—Sn solder alloy without having a detrimental effect on the environment and a soldered bond using the same.

To achieve the above object, according to the present invention, there are provided the following (1) and (2):

(1) A solder alloy consisting of Zn: 4.0–10.0 wt %, In: 1.0 to 15.0 wt %, Al: 0.0020 to 0.0100 wt %, and the balance of Sn and unavoidable impurities.

(2) A soldered bond of an electric or electronic device, composed of a solder alloy of the above (1).

BEST MODE FOR WORKING THE INVENTION

In the present invention, the reasons for limiting the contents of the metal ingredients are as follows:

Zn: 4.0 to 10.0 wt %

Zn is a basic metal ingredient for lowering the melting point of the solder alloy and improving the wettability. If the Zn content is in the range of 4.0 to 10.0 wt %, a stable, good wettability can be ensured. If the Zn content is less than 4 wt % or more than 10.4 wt %, the wettability falls.

Al: 0.0020 to 0.0100 wt %

Al is added to suppress the oxidation of the Sn—Zn alloy and ensure a good wettability. As explained above, Zn easily oxidizes. The oxide film formed on the solder surface enters between the base material and solder to obstruct the wetting of the base material by the solder. To obtain the effect of suppression of oxidation by the Al, it is necessary to make the Al content at least 0.0020 wt %. If the Al content is too great, however, the oxide film of Al will become thick and wettability will deteriorate as confirmed experimentally. Therefore, the upper limit of the Al content is made 0.0100 wt %.

In: 1.0 to 15.0 wt %

In further lowers the melting point of the solder alloy and further improves the wettability. To obtain this effect, it is necessary to make the In content at least 1.0 wt %. If the In content is too great, however, the oxidizability increases and the In reacts with the Pb contained in the electrode terminals of the electric and electronic device to form In—Pb, so the reliability of the solder bond cannot be secured. Further, In—Sn eutectic crystal appears, the solidus temperature excessively falls, and the bond becomes unstable with respect to temperature. Therefore, the upper limit of the In content is made 15.0 wt %.

The solder alloy, in particular the solder alloy for soldering of an electric and electronic device, requires the following characteristics:

1) Soldering is possible at a low temperature as close as possible to that of a conventional Sn—Pb eutectic solder alloy. That is, the melting point does not greatly exceed 190° C. and can be kept to about 210° C. at the highest.

2) The wettability with the base material is excellent.

3) There is no reaction with the base material to cause formation of a brittle compound layer or an embrittled layer.

4) The oxides of the alloy ingredients do not become causes of defects such as poor wettability, voids, and bridges.

5) A form of processing and supply suitable for soldering in a mass production process (solder paste, BGA solder balls, and other shapes) can be obtained.

The Zn—In—Al—Sn solder alloy of the present invention does not contain Pb, so is high in environmental safety and simultaneously has the above required characteristics.

EXAMPLES

Solder alloys having the various compositions shown in Table 1 were melted and measured for the melting point (liquidus temperature), the wetting time, and the bond strength by the following methods.

<Measurement of Melting Point>

A Seiko DSC measurement device (SSC-5040 DSC200) was used to determine the liquidus temperature as a representative value of the melting point by the DSC melting point measuring method (differential scanning calorimetry) at a weight of the evaluated sample of 10 mg and a rate of temperature rise of 5° C./min.

Figure 1:
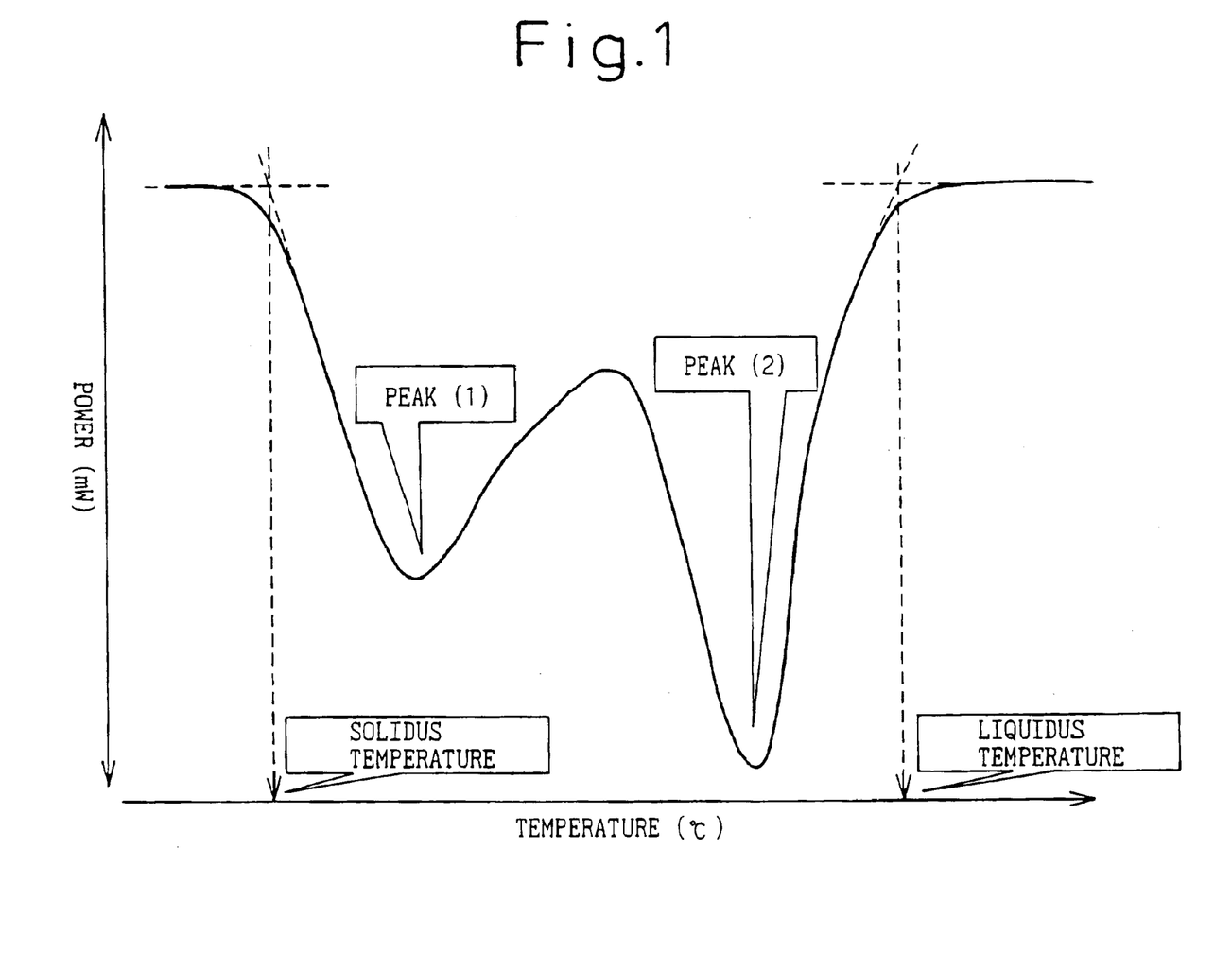
FIG. 1 is a graph showing the measurement item of the melting point by the DSC method for evaluating the melting point of the solder alloy.

According to this measurement method, along with the rise in temperature, the solidus, eutectic peak, and liquidus are detected in order from the low temperature side. Depending on the composition of the alloy, as shown in FIG. 1, two eutectic peaks sometime appear. In this case, they are measured as the "peak (1)" and "peak (2)" from the low temperature side.

<Measurement of Wetting Time>

A Rhesca Meniscus Tester (Solder Checker Model SAT-5000) was used to measure the wetting time as a representative value of the wettability by the following meniscus test method. Note that the test atmosphere was air.

[Meniscus Test Method]

Copper plates (5 mm×40 mm×0.1 mm thickness) cleaned with an aqueous solution of hydrochloric acid (about 1.2 mol/liter) were coated with an RMA type flux (Tamura Kaken ULF-500VS), then immersed in solder alloy melts heated to 240° C., 250° C., and 260° C. at an immersing speed of 20 mm/sec to an immersing depth of 5 mm and measured for the wetting time. The measurement time was made up to 8 sec.

Figure 2:
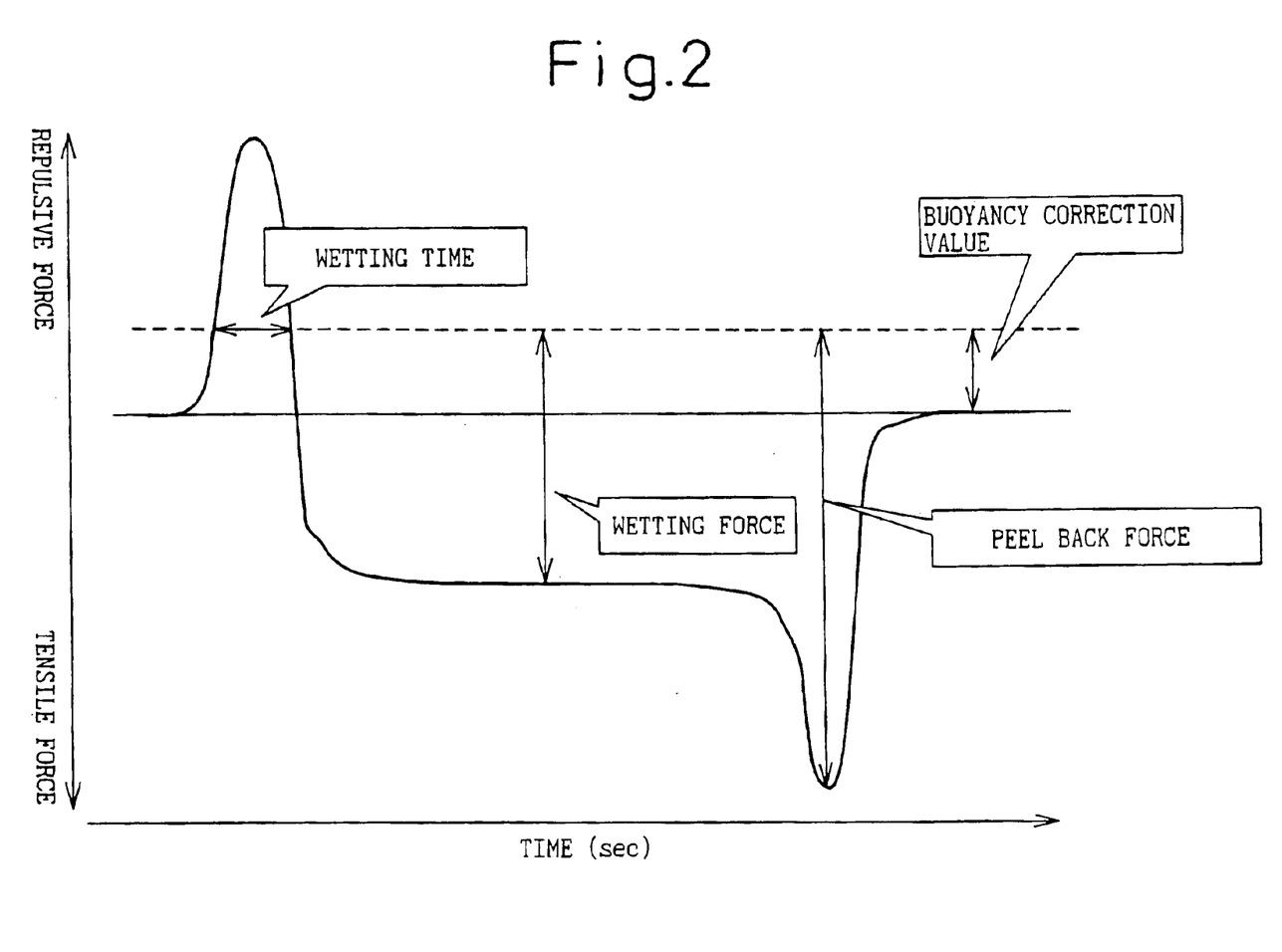
FIG. 2 is a graph showing the measurement items in a meniscus test for evaluating the wettability of the solder alloy.

The meniscus test produced a measurement chart as shown in FIG. 2. From this chart, the wetting time, the wetting force, the peel back force, etc. can be read. Among these, in the present embodiment, the wettability was evaluated by the wetting time accurately reflecting the alloy composition.

<Measurement of Bond Strength of Part Leads>

The solder alloy powder of the present invention shown in Table 2 was used to measure the bond strength of the part leads.

As the evaluated part, a QFP208pin mold was placed on a copper board. Simulating the soldering at the time of mounting, this was passed through a nitrogen reflow oven two times at a peak temperature of 215° C. so as to solder the lead pins of the mold on the board.

Figure 3:
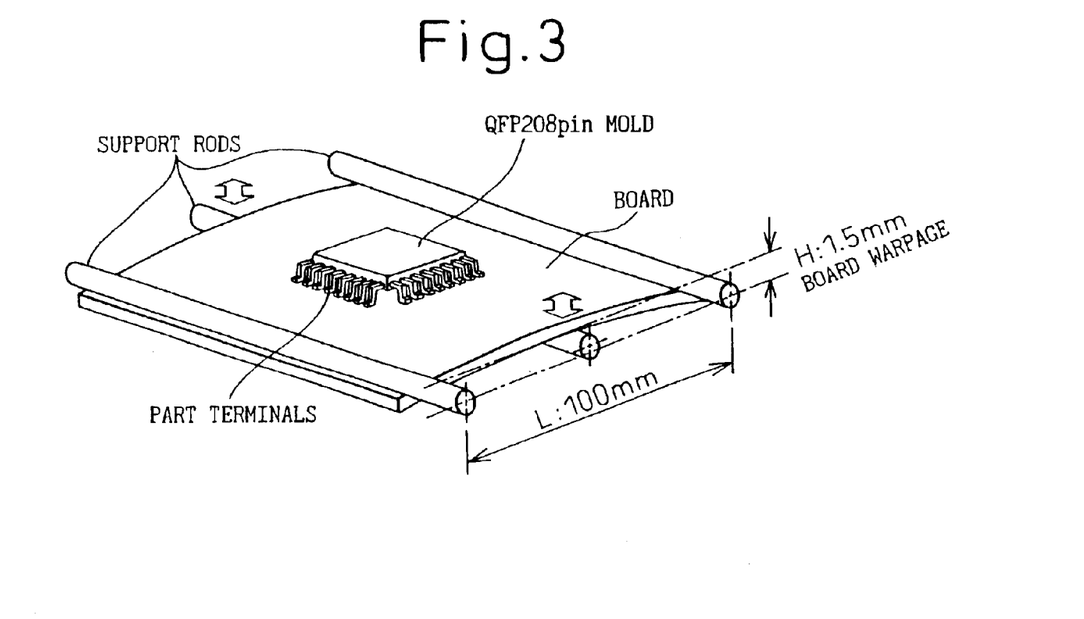
FIG. 3 is a perspective view of the method of a high temperature load holding test (150° C./100 hours) using a QFP part package.

After soldering, as a severity test, as shown in FIG. 3, the board was held in a state given warpage of bending of 1.5 mm/100 mm span in the atmosphere in a thermostat of 150° C. for 100 hours.

Figure 4:
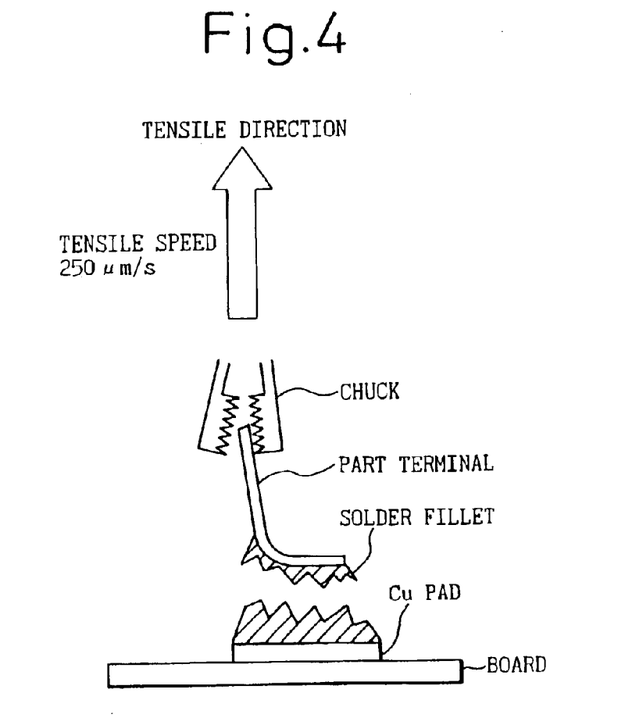
FIG. 4 is a front view of the test method of a solder bond strength of part leads using a QFP part package.

After the severity test, the package parts were cut from the leads of the evaluation part, then, using a Dage bond strength tester (Dage Series 4000), the lead parts (part terminals) were gripped by the chucks as shown in FIG. 4 and pulled in the vertical direction at a speed of 250 μm/s to measure the bond strength. Note that the measurement was performed for 40 pins among the total 208 pins (that is, n=40 repetitions).

Details of the bond strength test conditions are as shown in the notes under Table 2.

<Measurement of Solder Balls Occurrence Rate>

Figure 5:
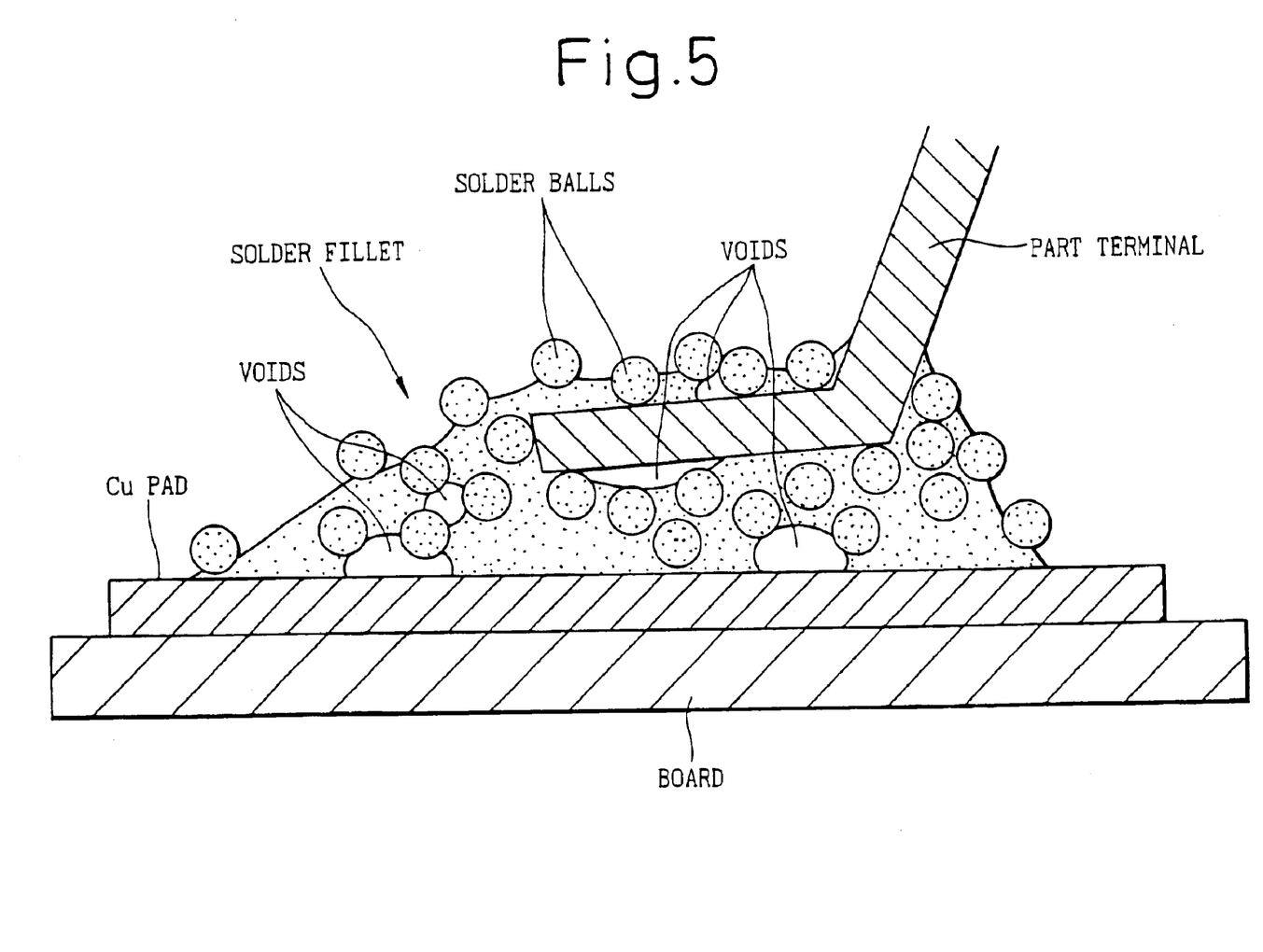
FIG. 5 is a schematic view of the state of occurrence of solder balls.

Solder balls remain in their original state as shown in FIG. 5 without the solder powder particles melting together due to oxidation of the solder powder at the time of reflow heating. Therefore, if solder balls occur, sound solder filletsarising from complete melting and coagulation will not be formed and unmelted portions will be left as voids. Accordingly, highly reliable soldered bonds cannot be formed. Note that in FIG. 5, for convenience in illustration, the solder balls are shown larger than in actuality.

The solder fillet parts after reflowing were observed under an optical microscope (power: ×100) and the solder ball occurrence rate was found by the following equation:

Rate of occurrence (%)=(Number occurring/Number of observed solder fillets)×100

Details of the ball occurrence test conditions are as shown in the notes under Table 3.

<Evaluation of Results of Measurement>

[Evaluation of Melting Point and Wettability]

Table 1—1 and Table 1-2 show the results of measurement of the melting point and wettability.

(1) Effects of Zn Content

Figure 6:
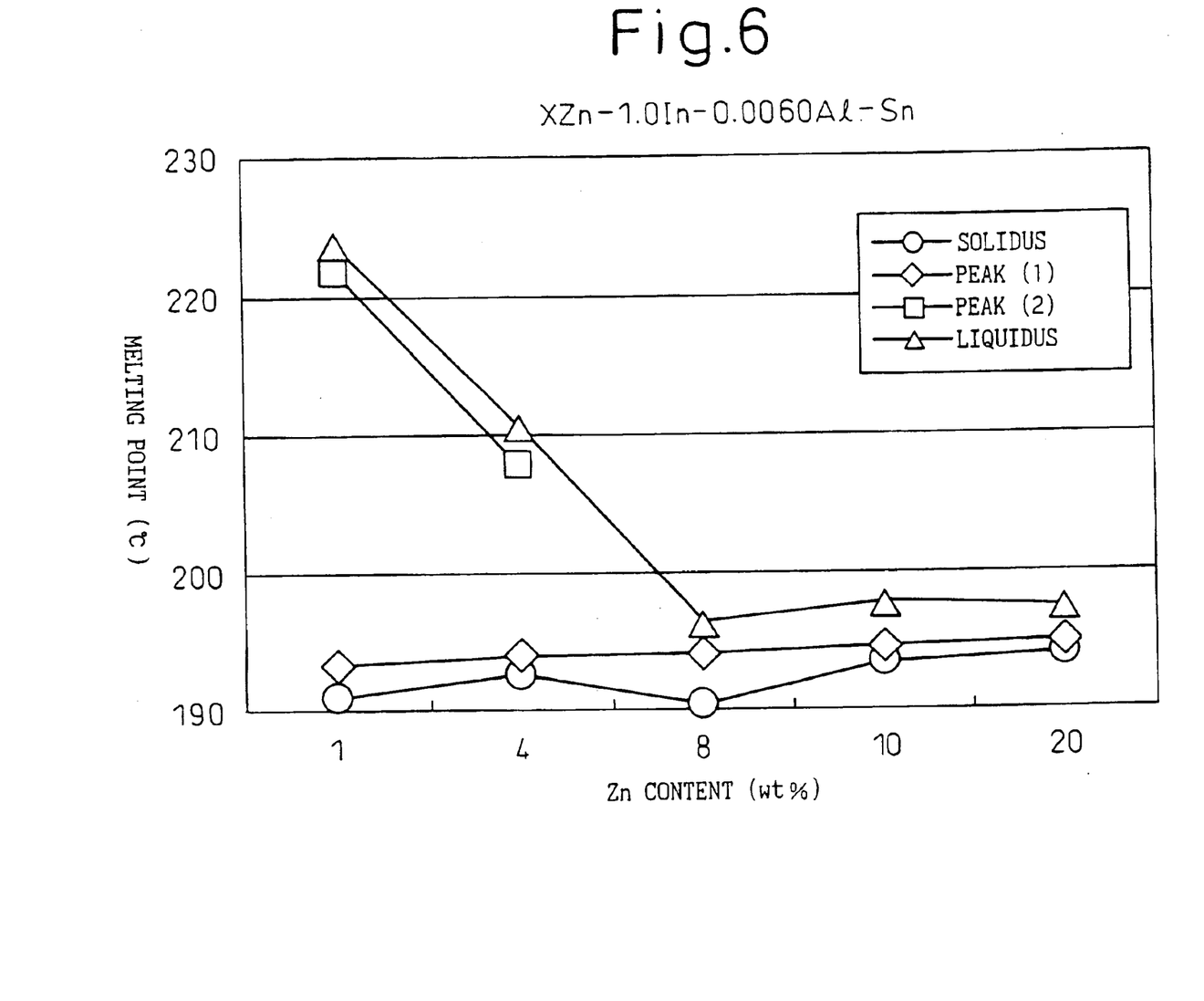
FIG. 6 is a graph showing the relationship of the Zn content (X) of a X wt % Zn-1.0 wt % In-0.0060 wt % Al—Sn solder alloy and the melting point (liquidus temperature).
Figure 7:
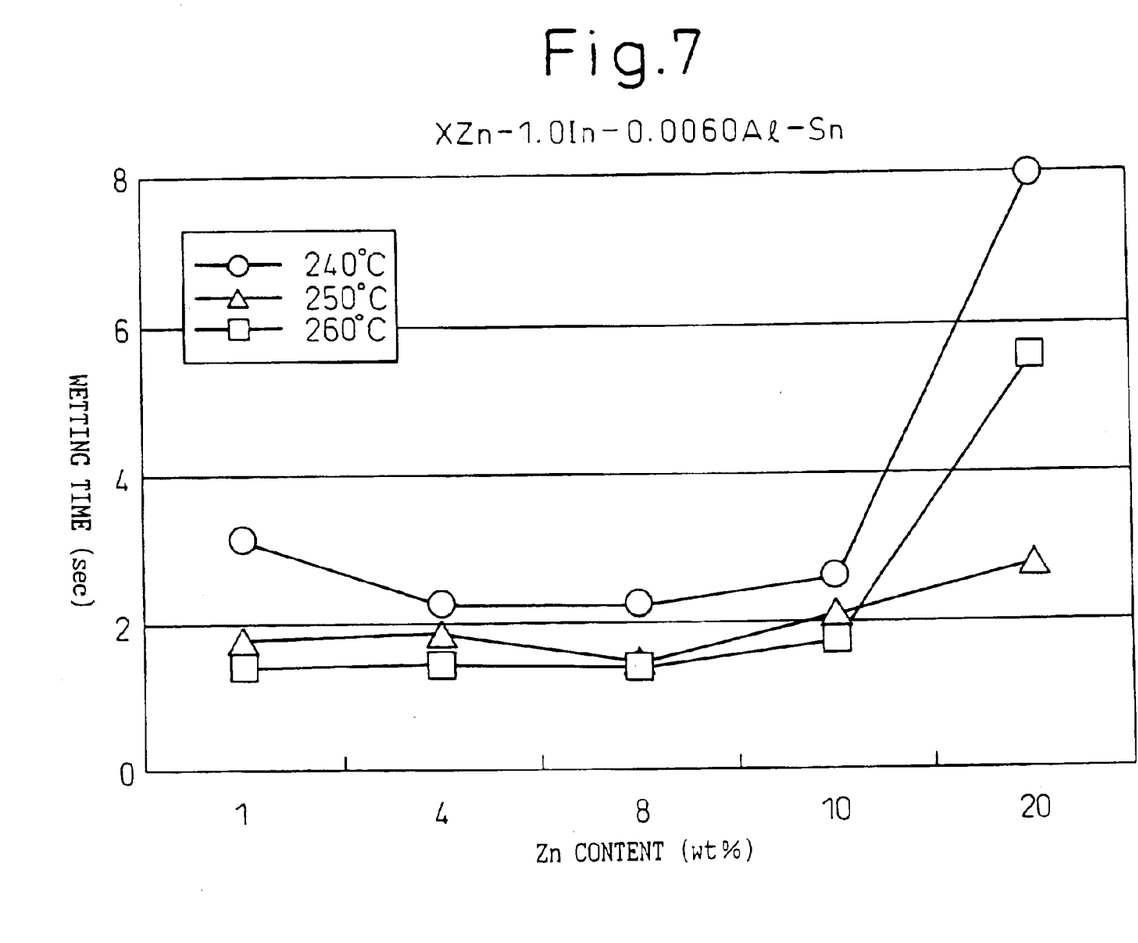
FIG. 7 is a graph showing the relationship of the Zn content (X) of a X wt % Zn-1.0 wt % In-0.0060 wt % Al—Sn solder alloy and the wetting time.

FIG. 6 and FIG. 7 show the relationship between the Zn content and the melting point (liquidus temperature) and the relationship between the Zn content and the wetting time for Sample Nos. 9 to 13 (1.0 to 20.0 wt % Zn-0.0060 wt % Al—Sn) of Table 1. Here, the 0.0060 wt % Al is within the range of the present invention, while the 1.0 wt % In is also within the range of the present invention.

As shown in FIG. 6, samples where the In content and the Al content are the above values in the range of the present invention and the Zn content is in the range of the present invention (4.0 to 10.0 wt %) gave practical sufficiently low melting points of not more than about 210° C. by the liquidus. In particular, if the Zn content is 8 wt % or more, a low melting point of less than 200° C. by the liquidus is obtained. This is further preferable.

As shown in FIG. 7, samples having an In content and Al content of the above values in the range of the present invention and having a Zn content in the range of the present invention (4.0 to 10.0 wt %) gave a short wetting time and a stable, good wettability. Whether the Zn content is smaller than or greater than the range of the present invention, the wetting time tends to increase and a good wettability cannot be stably secured.

(2) Effect of In Content

Figure 8:
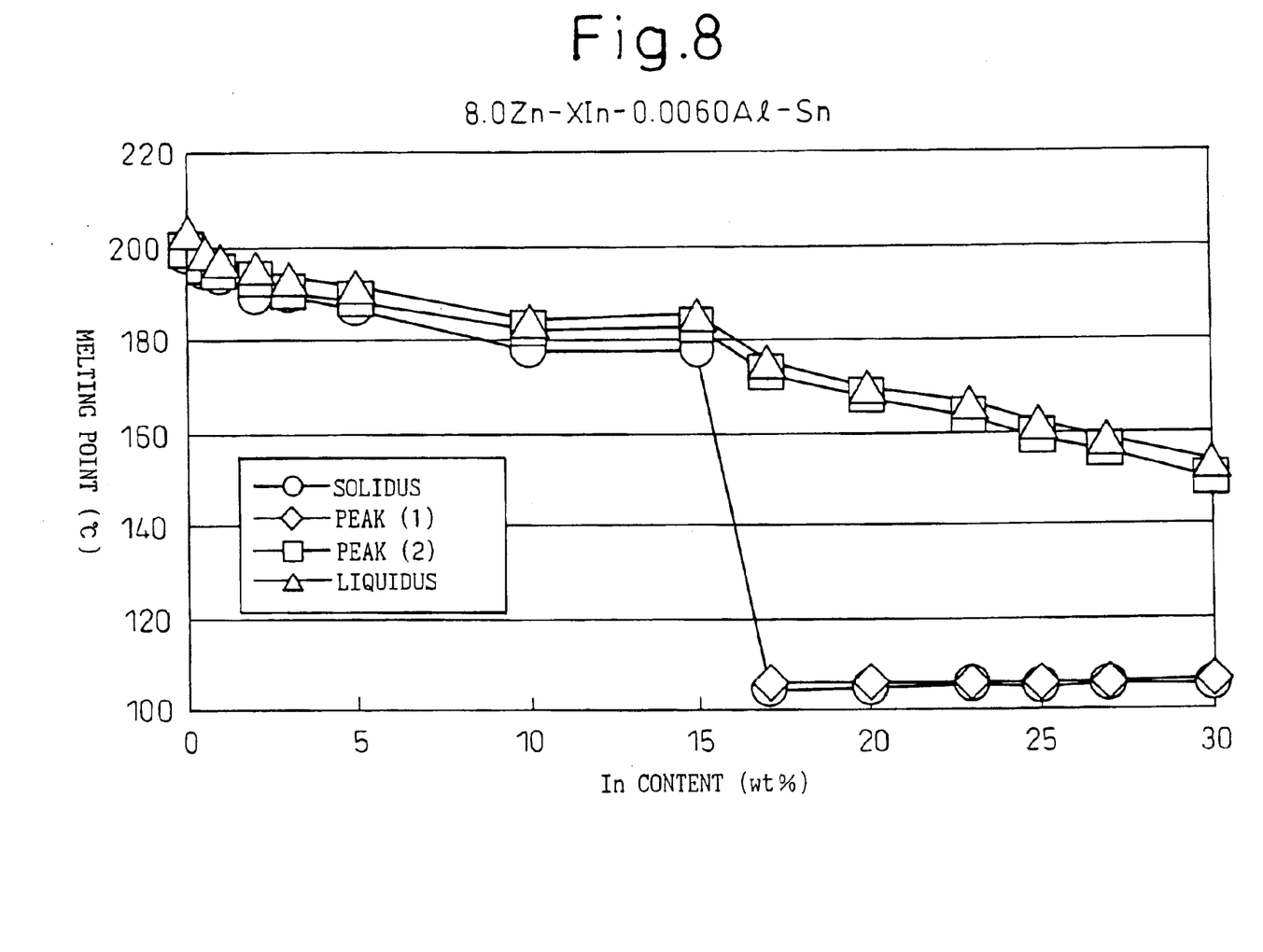
FIG. 8 is a graph showing the relationship of the In content (X) of a 8.0 wt % Zn—X wt % In-0.0060 wt % Al—Sn solder alloy and the melting point (liquidus temperature).
Figure 9:
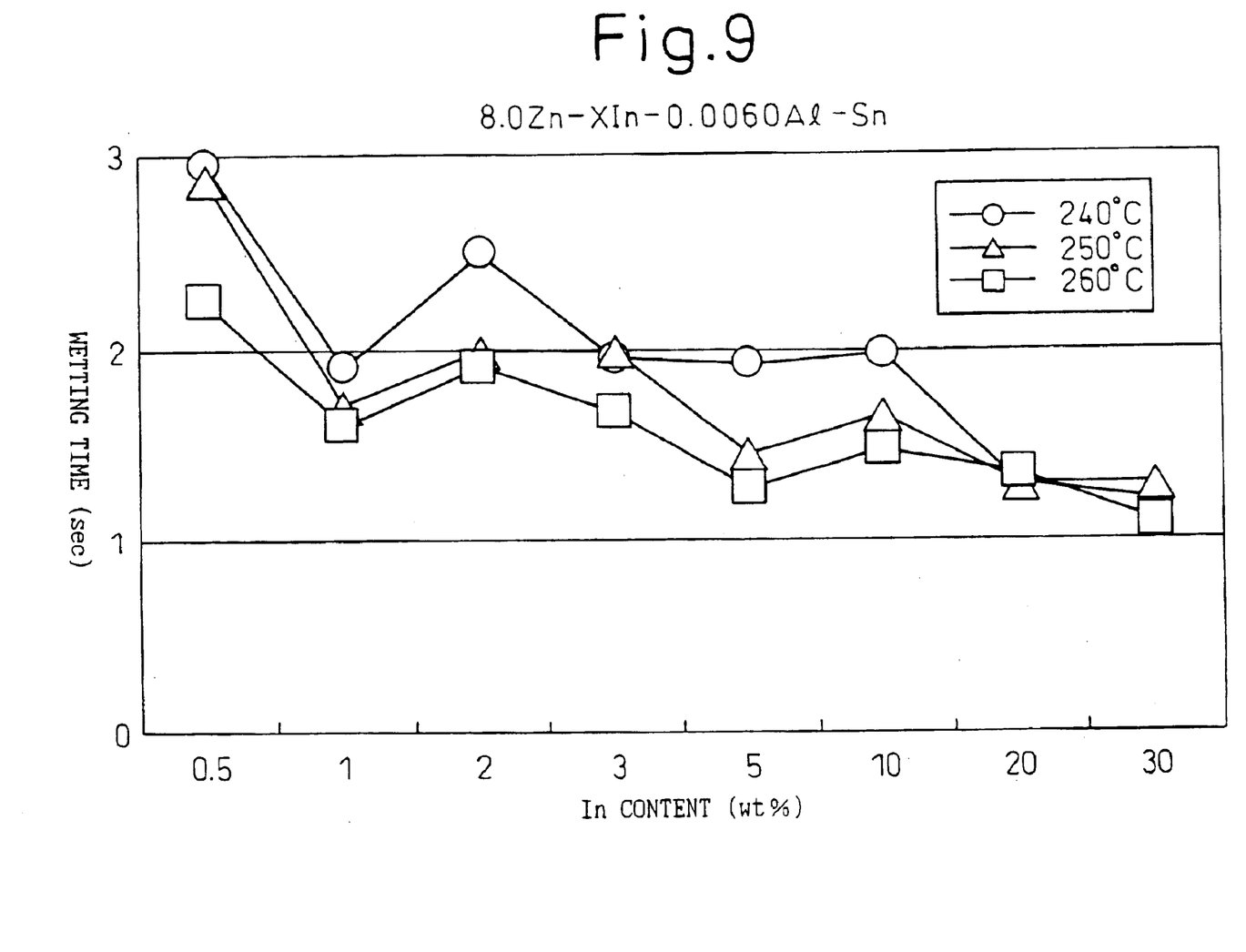
FIG. 9 is a graph showing the relationship of the In content (X) of a 8.0 wt % Zn—X wt % In-0.0060 wt % Al—Sn solder alloy and the wetting time.

FIG. 8 and FIG. 9 show the relationship between the In content and the melting point (liquidus temperature) and the relationship between the In content and the wetting time for Sample Nos. 19 to 32 (8.0 wt % Zn-0 to 30.0 wt % In-0.0060 wt % Al—Sn) of Table 1. Here, the 0.0060 wt % Al is an Al content within the range of the present invention.

Sample Nos. 21 to 26 where the Al content is the above value in the range of the present invention and the In content is in the range of the present invention (1.0 to 15.0 wt %) gave low melting points (FIG. 8) and stable, good wettability (wetting in a short time) (FIG. 9).

As opposed to this, Sample Nos. 19 to 20 where the Al content is the range of the present invention, but the In content is less than the range of the present invention gave low wettability (wetting in a short time) (FIG. 9).

Further, Sample Nos. 27 to 32 having an In content greater than the range of the present invention gave a solidus temperature of about 105° C. or too low and therefore a soldered bond unstable with respect to temperature and unsuitable for practical use. This is because if the In content exceeds the 15 wt % upper limit of the range of the present invention, a peak (1) considered to correspond to the In—Sn eutectic crystal appears near 105° C. and along with this, the solidus temperature falls (FIG. 8, Table 1—1).

(3) Effect of Al Content

Figure 10:
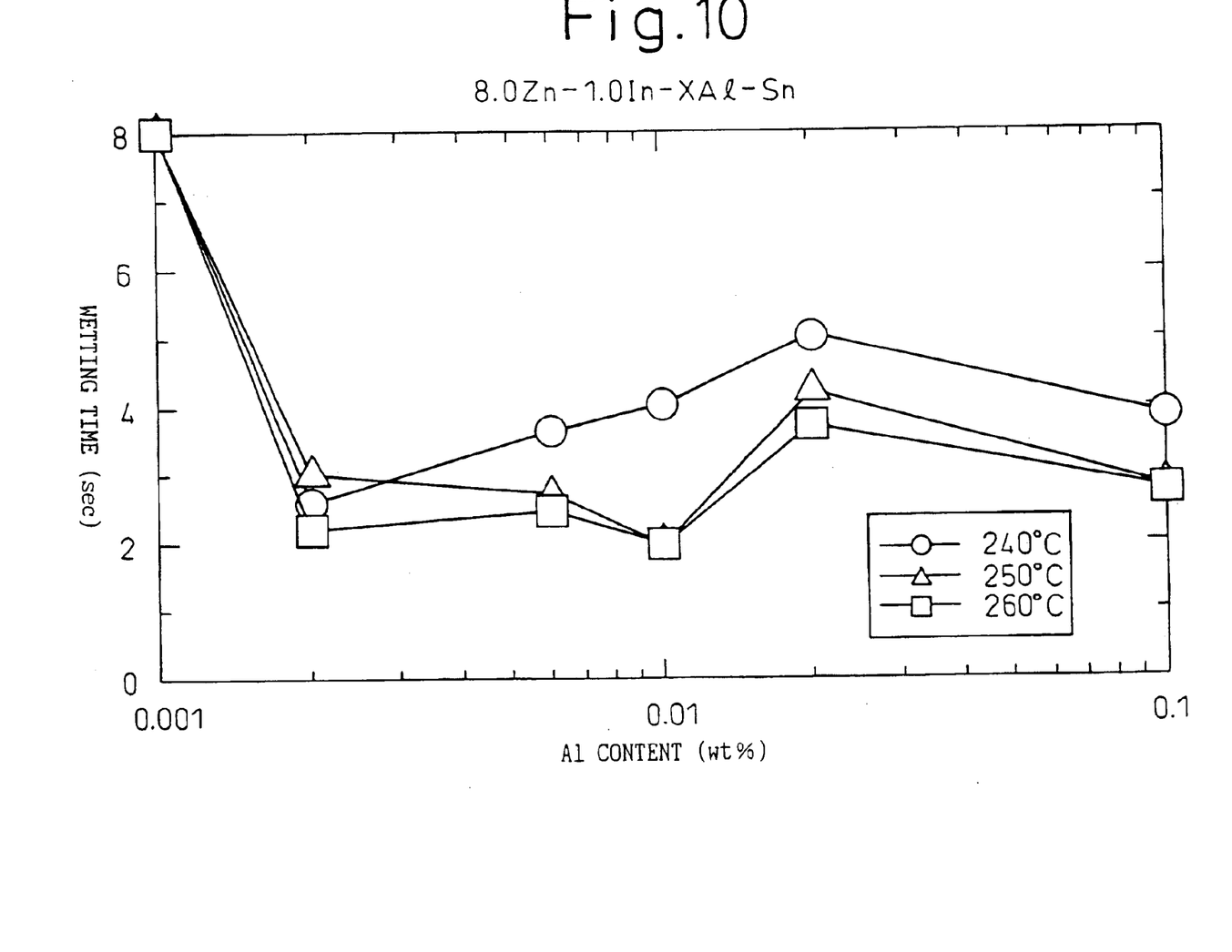
FIG. 10 is a graph showing the relationship of the Al content (X) of a 8.0 wt % Zn-1.0 wt % In—X wt % Al—Sn solder alloy and the wetting time.

FIG. 10 shows the relationship between the Al content and the wetting time for Sample Nos. 1 to 8 (8.0 wt % Zn-1.0 wt % In-0 to 0.1000 wt % Al—Sn) of Table 10. Here, the 8.0 wt % Zn and the 1.0 wt % are a Zn content and Al content within the range of the present invention.

Sample Nos. 4 to 6 where the Zn content and the In content are the above values in the range of the present invention and the Al content is in the range of the present invention gave stable, good wettability (wetting in a short time).

As opposed to this, Sample Nos. 1 to 3 where the Zn content and the In content are the above values in the range of the present invention, but the Al content is less than the range of the present invention and Sample Nos. 7 to 9 where the Al content is more than the range of the present invention gave lower wettability (wetting in a longer time). Further, if the Al content is larger, the Al precipitates at the surface at the time of formation of the solder powder (φ20 to 45 μm) and this cannot be used as solder paste.

Further, there is no particular problem even if the solder alloy of the present invention contains a small amount of oxygen, nitrogen, hydrogen, or other unavoidable impurities. If a large amount of oxygen is present, however, the solder alloy is liable to become brittle, so the oxygen content should be made extremely small.

In particular, the concentration of oxygen at the time of formation of the solder powder (φ20 to 45 μm) should be made not more than 120 ppm.

[Evaluation of Bond Strength]

Figure 11:
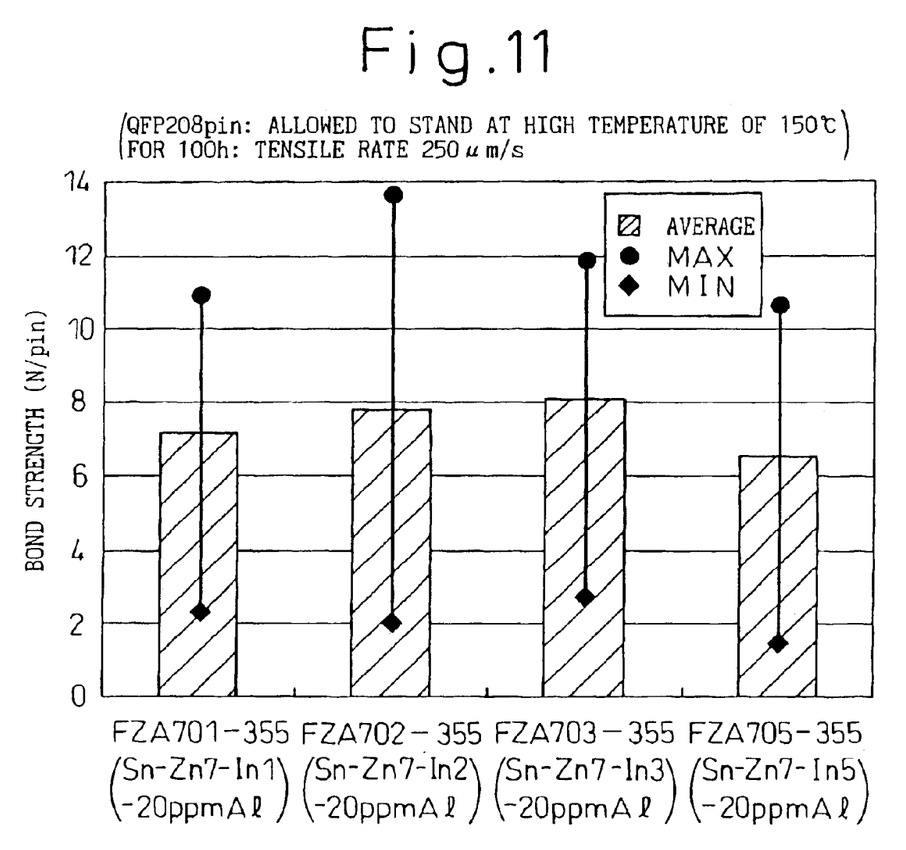
FIG. 11 is a graph showing the results of measurement of the solder bond strength of part leads of a solder alloy.

Table 2 and FIG. 11 show the results of measurement of the bond strengths of part leads for the 7 wt % Zn-1.0 to 5.0 wt % In-0.0020 wt % Al—Sn according to the present invention (Sample Nos. 41 to 44).

In general, as the target level for evaluating the bond strength, the strength in the state as soldered, that is, the strength in the state without a severity test (initial strength), would be sufficient if an average of at least 4N/pin and a minimum of at least 1N/pin in a test of n=40 repetitions.

In the present embodiment, the bond strength after a severity test cleared the target level for the initial strength. An extremely good bond strength could be obtained.

[Evaluation of Solder Ball Occurrence Rate]

Figure 12:
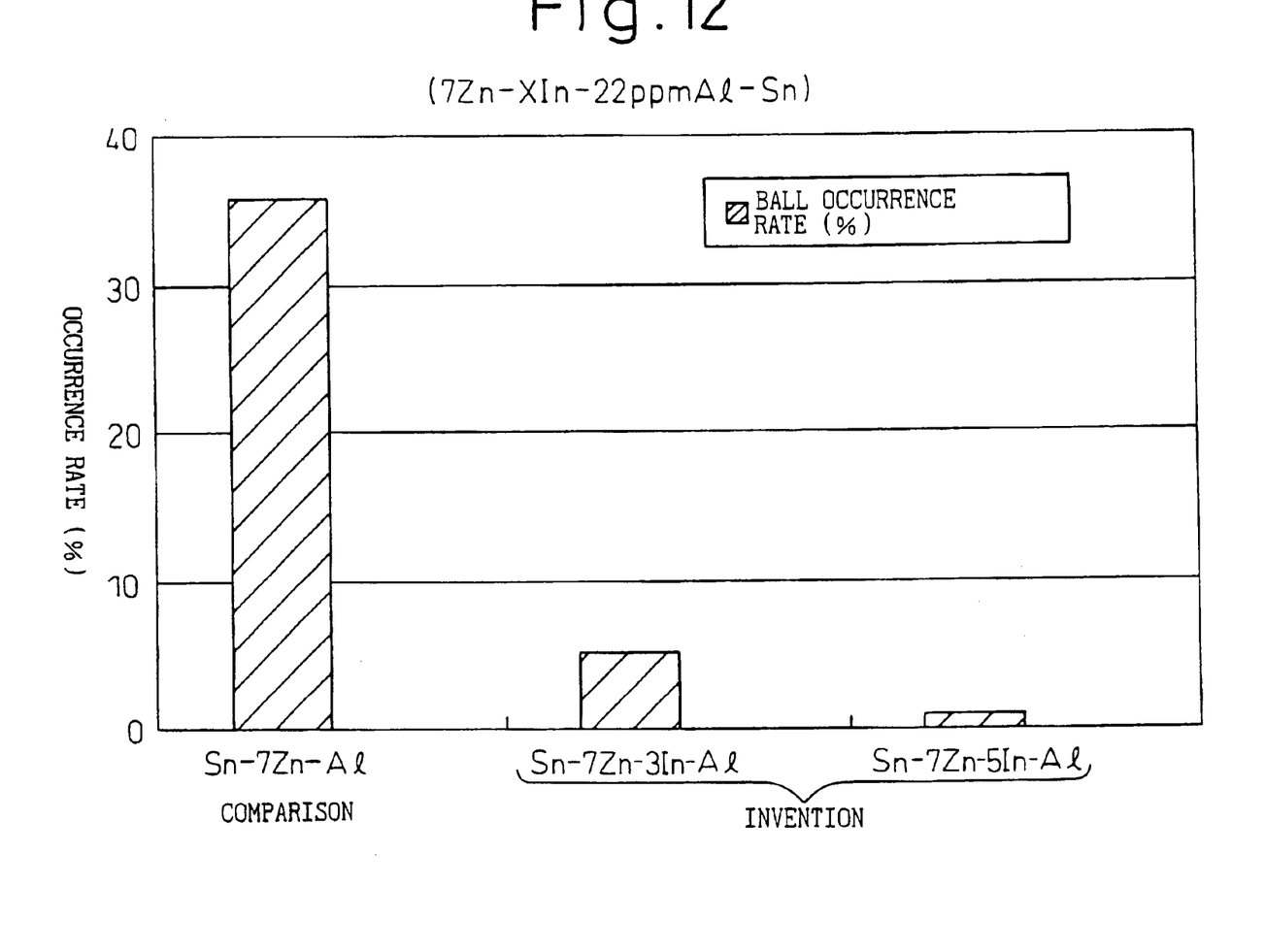
FIG. 12 is a graph showing the solder ball occurrence rate at a solder bond fillet.

Table 3 and FIG. 12 show the results of measurement of the solder ball occurrence rate for 7 wt % Zn-0 to 5 wt % In-0.0022 wt % Al—Sn solder alloy (Sample Nos. 51 to 53).

As shown in the results, compared with the comparative example with no In added (Sample No. 51), the examples of the invention containing 3 wt % or 5 wt % of In (Sample Nos. 52 and 53) are greatly reduced in the solder ball occurrence rate and good solderability can be ensured.

TABLE 1-1

Results of Measurement of Melting Point

| Class | Sample no. | Composition (wt %) Zn | In | Al | Sn | Melting Point (° C.) Solidus | Peak (1) | Peak (2) | Liquidus |
|---|---|---|---|---|---|---|---|---|---|
| Comp. | 1 | 8.0 | 1.0 | — | Bal. | 190.6 | — | 194.1 | 196.5 |
|  | 2 | " | " | 0.0005 | " | " | — | " | " |
|  | 3 | " | " | 0.0010 | " | " | — | " | " |
| Inv. | 4 | " | " | 0.0020 | " | " | — | " | " |
|  | 5 | " | " | 0.0060 | " | " | — | " | " |
|  | 6 | " | " | 0.0100 | " | " | — | " | " |
| Comp. | 7 | " | " | 0.0200 | " | " | — | " | " |
|  | 8 | " | " | 0.1000 | " | " | — | " | " |
|  | 9 | 1.0 | " | 0.0060 | " | 190.9 | 193.3 | 211.8 | 223.8 |
| Inv. | 10 | 4.0 | " | " | " | 192.7 | 194.1 | 201.9 | 210.6 |
|  | 11 | 8.0 | " | " | " | 190.6 | — | 194.1 | 196.5 |
|  | 12 | 10.0 | " | ∝1 | ∝1 | 193.5 | — | 194.7 | 197.9 |
| Comp. | 13 | 20.0 | " | " | " | 194.1 | — | 194.9 | 197.6 |
| Inv. | 14 | 7.0 | 1.0 | " | " | 193.4 | — | 194.7 | 197.7 |
|  | 15 | " | 2.0 | " | " | 188.4 | — | 192.7 | 195.7 |
|  | 16 | " | 3.0 | " | " | 189.5 | — | 190.4 | 197.6 |
|  | 17 | " | 5.0 | " | " | 185.1 | — | 188.2 | 1990.6 |
|  | 18 | " | 10.0 | " | " | 175.2 | — | 181.4 | 184.1 |
| Comp. | 19 | 8.0 | — | " | " | 198.3 | — | 199.0 | 203.5 |
|  | 20 | " | 0.5 | " | " | 194.6 | — | 195.6 | 199.1 |
| Inv. | 21 | " | 1.0 | " | " | 193.2 | — | 194.5 | 197.6 |
|  | 22 | " | 2.0 | " | " | 188.8 | — | 193.0 | 195.7 |
|  | 23 | " | 3.0 | " | " | 189.6 | — | 190.3 | 193.7 |
|  | 24 | " | 5.0 | " | " | 186.8 | — | 188.7 | 191.9 |
|  | 25 | " | 10.0 | " | " | 177.8 | — | 182.3 | 184.3 |
|  | 26 | " | 15.0 | " | " | 177.9 | — | 182.9 | 177.9 |
| Comp. | 27 | " | 17.0 | " | " | 104.1 | 105.4 | 172.5 | 175.3 |
|  | 28 | " | 20.0 | " | " | 104.4 | 105.4 | 167.5 | 170.0 |
|  | 29 | " | 23.0 | " | " | 105.1 | 105.6 | 162.9 | 166.5 |
|  | 30 | " | 25.0 | " | " | 104.4 | 105.6 | 158.8 | 162.0 |
|  | 31 | " | 27.0 | " | " | 104.9 | 106.9 | 155.9 | 185.9 |
|  | 32 | " | 30.0 | " | " | 105.1 | 106.0 | 149.6 | 153.5 |
|  | 33 | Pb 63 |  |  | " | 178.7 | — | 183.0 | 187.5 |
|  | 34 | Ag 3.0, Cu 0.7 |  |  | " | 216.5 | — | 217.6 | 221.1 |
|  | 35 | 9.0 | — | — | " | 198.5 | — | 198.7 | 201.9 |
|  | 36 | 8.0 | Bi 3.0 | — | " | 195.1 | — | 195.7 | 198.5 |

TABLE 1-2

Results of Measurement of Wettability

| Class | Sample no. | Composition (wt %) Zn | In | Al | Sn | Wetting time at measurement temperature (sec) (Note) 240° C. | | 250° C. | | 246° C. | |
|---|---|---|---|---|---|---|---|---|---|---|---|
| Comp. | 1 | 8.0 | 1.0 | — | Bal. | x | 0/4 | x | 0/4 | x | 0/4 |
|  | 2 | " | " | 0.0005 | " | x | 0/4 | x | 0/4 | x | 0/4 |
|  | 3 | " | " | 0.0010 | " | x | 0/4 | x | 0/4 | x | 0/4 |
| Inv. | 4 | " | " | 0.0020 | " | 2.6 | 4/4 | 3.0 | 4/4 | 2.2 | 4/4 |
|  | 5 | " | " | 0.0060 | " | 3.7 | 4/4 | 2.7 | 4/4 | 2.5 | 4/4 |
|  | 6 | " | " | 0.0100 | " | 4.1 | 4/4 | 2.0 | 4/4 | 2.0 | 4/4 |
| Comp. | 7 | " | " | 0.0200 | " | 5.1 | 4/4 | 4.2 | 4/4 | 3.7 | 4/4 |
|  | 8 | " | " | 0.1000 | " | 3.9 | 4/4 | 2.8 | 4/4 | 2.8 | 4/4 |
|  | 9 | 1.0 | " | 0.0060 | " | 3.1 | 4/4 | 1.8 | 4/4 | 1.4 | 4/4 |
| Inv. | 10 | 4.0 | " | " | " | 2.2 | 4/4 | 1.9 | 4/4 | 1.5 | 4/4 |
|  | 11 | 8.0 | " | " | " | 2.2 | 4/4 | 1.5 | 4/4 | 1.4 | 4/4 |
|  | 12 | 10.0 | " | " | ∝1 | 2.6 | 4/4 | 2.1 | 4/4 | 1.8 | 4/4 |
| Comp. | 13 | 20.0 | " | " | " | x | 0/4 | 2.8 | 1/4 | 5.6 | 4/4 |
|  | 19 | 8.0 | — | " | " | 1.5 | 4/4 | 1.4 | 4/4 | 1.5 | 4/4 |
|  | 20 | " | 0.5 | " | " | 3.0 | 4/4 | 2.9 | 4/4 | 2.3 | 4/4 |
| Inv. | 21 | " | 1.0 | " | " | 1.9 | 4/4 | 1.7 | 4/4 | 1.6 | 4/4 |
|  | 22 | " | 2.0 | " | " | 2.5 | 4/4 | 2.0 | 4/4 | 1.9 | 4/4 |
|  | 23 | " | 3.0 | " | " | 2.0 | 4/4 | 2.0 | 4/4 | 1.7 | 4/4 |
|  | 24 | " | 5.0 | " | " | 1.9 | 4/4 | 1.5 | 4/4 | 1.3 | 4/4 |
|  | 25 | " | 10.0 | " | " | 2.0 | 4/4 | 1.7 | 4/4 | 1.5 | 4/4 |
|  | 26 | " | 15.0 | " | ∝1 | 1.2 | 4/4 | 1.2 | 4/4 | 1.2 | 4/4 |

TABLE 1-2-continued

Results of Measurement of Wettability

| Class | Sample no. | Composition (wt %) | | | | Wetting time at measurement temperature (sec) (Note) | | | | | |
|---|---|---|---|---|---|---|---|---|---|---|---|
| | | Zn | In | Al | Sn | 240° C. | | 250° C. | | 246° C. | |
| Comp. | 27 | " | 17.0 | " | " | Undetermined | | | | | |
| | 28 | " | 20.0 | " | " | 1.4 | 4/4 | 1.3 | 4/4 | 1.4 | 4/4 |
| | 29 | " | 23.0 | " | " | Undetermined | | | | | |
| | 30 | " | 25.0 | " | " | Undetermined | | | | | |
| | 31 | " | 27.0 | " | " | Undetermined | | | | | |
| | 32 | " | 30.0 | " | " | 1.2 | 4/4 | 1.3 | 4/4 | 1.1 | 4/4 |
| | 33 | | Pb 63 | | " | 1.0 | 4/4 | 0.8 | 4/4 | 0.7 | 4/4 |
| | 34 | | Ag 3.0, Cu 0.7 | | " | 2.0 | 4/4 | 1.2 | 4/4 | 0.9 | 4/4 |
| | 35 | 9.0 | — | — | " | x | 0/4 | x | 0/4 | x | 0/4 |
| | 36 | 8.0 | Bi 3.0 | — | " | x | 04 | x | 0/4 | x | 0/4 |

(Note) 1: The figures shown by decimal point expressions indicate the wetting time (sec), the denominators of the figures shown by fractional expressions such as "4/4" show the numbers of repeated measurements, while the numerators show the measurable numbers. "x" means measurement was not possible.
(Note) 2: Wetting test condition (test atmosphere is in the air)

Counterpart material (base material): Untreated Cu: 5.0×40.0×0.1 mm

Immersion volume: 5.0×5.0×0.1 mm

Flux: ULF-500VS made by Tamura Kaken

Tester: Solder Checker Model SAT-5000 made by RHESCA

TABLE 2

Results of Bond Strength Test

| Class | Sample no. | Composition (wt %) | | | | Bond strength (N/pin) | | | |
|---|---|---|---|---|---|---|---|---|---|
| | | Zn | In | Al | Sn | Ave. | Max. | Min. | σ |
| Inv. | 41 | 7.0 | 1.0 | 0.0020 | Bal. | 7.2 | 10.9 | 2.3 | 2.3 |
| | 42 | " | 2.0 | " | " | 7.8 | 13.7 | 2.0 | 2.7 |
| | 43 | " | 3.0 | " | " | 8.1 | 11.9 | 2.7 | 2.3 |
| | 44 | " | 5.0 | " | " | 6.5 | 10.7 | 1.5 | 2.4 |

Bond Strength Test Conditions

Part evaluated: QFP208pin, lead material: Cu, lead plating: Sn-10Pb (wt %)

Evaluated board: Heat resistant preflux Cu through board

Solder powder: φ38–45 μm (88 wt %) made by Mitsui Mining & Smelting

Solder paste flux: SZ355-GK-2 (12 wt %) made by Nihon Genma Mfg.

Solder paste printed board: Screen board made by Process Lab Micron, material: stainless steel, thickness: 150 μm Tensile tester: Dage series 4000 made by Dage Reflow condition: $N_2$ reflow, bond peak temperature 215° C., oxygen concentration not more than 500 ppm Reflow apparatus: Solsys-310N21RPC made by Nippon Antom Industrial Number of repetitions: n=40

TABLE 3

Results of Test of Solder Balls

| Class | Sample no. | Composition (wt %) | | | | QFP208pin Ball occurrence rate (%) |
|---|---|---|---|---|---|---|
| | | Zn | In | Al | Sn | |
| Comp. | 51 | 7.0 | — | 0.0022 | Bal. | 35.81 |
| Inv. | 52 | " | 3.0 | " | " | 4.97 |
| | 53 | " | 5.0 | " | " | 0.80 |

Ball Occurrence Test Conditions

Part evaluated: QFP208pin, lead material: Cu, lead plating: Sn-10Pb (wt %)

Evaluated board: Heat resistant preflex Cu through board

Solder powder: φ38–45 μm (88 wt %) made by Mitsui Mining & Smelting

Solder paste flux: SZ355-GK-2 (12 wt %) made by Nihon Genma Mfg.

Solder paste printed board: Screen board made by Process Lab Micron Co., material: stainless steel, thickness: 150 μm Tensile tester: Dage series 4000 made by Dage Reflow condition: $N_2$ reflow, bond peak temperature 215° C., oxygen concentration not more than 500 ppm Reflow apparatus: Solsys-310N21RPC made by Nippon Antom Industrial Ball occurrence rate (%)=(number of balls occurring/208 pins)×100

INDUSTRIAL APPLICABILITY

According to the present invention, there are provided a solder alloy having a solderability comparable to that of a conventional Pb—Sn solder alloy without having a detrimental effect on the environment and a soldered bond using the same.

What is claimed is:
1. A solder alloy consisting of Zn: 4.0–10.0 wt %, In: 1.0 to 15.0 wt %, Al: 0.0020 to 0.0100 wt %, and the balance of Sn and unavoidable impurities.
2. A solder alloy as set forth in claim 1, wherein the Zn content is at least 8.0 wt %.
3. A soldered bond of an electric or electronic device, composed of a solder alloy of claim 1 or 2.

* * * * *